US010663416B2

(12) United States Patent
Fukuda

(10) Patent No.: US 10,663,416 B2
(45) Date of Patent: May 26, 2020

(54) PATTERN MEASURING METHOD, PATTERN MEASURING APPARATUS, AND COMPUTER PROGRAM STORAGE DEVICE

(71) Applicant: Hitachi High-Technologies Corporation, Minato-ku, Tokyo (JP)

(72) Inventor: Hiroshi Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 29 days.

(21) Appl. No.: 16/159,977

(22) Filed: Oct. 15, 2018

(65) Prior Publication Data
US 2019/0120777 A1 Apr. 25, 2019

(30) Foreign Application Priority Data
Oct. 23, 2017 (JP) .................. 2017-204144

(51) Int. Cl.
*H01J 37/06* (2006.01)
*H01J 37/28* (2006.01)
(Continued)

(52) U.S. Cl.
CPC .......... *G01N 23/2251* (2013.01); *H01J 37/06* (2013.01); *H01J 37/222* (2013.01);
(Continued)

(58) Field of Classification Search
CPC .. G06K 9/6203; G06K 9/6857; G06K 9/6202; G06K 9/6253; G06K 9/6255;
(Continued)

(56) References Cited

U.S. PATENT DOCUMENTS 7,285,777 B2 10/2007 Kawada et al.
7,619,751 B2 11/2009 Yamaguchi et al.
(Continued)

FOREIGN PATENT DOCUMENTS

JP 3823117 B2 9/2006
JP 4801427 B2 10/2011

*Primary Examiner* — David A Vanore
(74) *Attorney, Agent, or Firm* — Crowell & Moring LLP

(57) ABSTRACT

The present invention is directed to a pattern measuring method and the like for deriving a roughness evaluation value from which measurement noise having a frequency component is removed. The pattern measuring method includes generating a plurality of integration signals having the different number of integration from the signals of the plurality of frames; acquiring edge position information of the pattern along an edge from the plurality of respective integration signals having the different number of integration; obtaining a difference between the edge position information and reference position information; obtaining a spectral component of a specific spatial frequency of the edge or a standard deviation based upon the difference; performing regression analysis in which a value relating to the number of integration is set as an explanatory variable, and a value relating to the spectral component or the standard deviation is set as a target variable; and outputting a value obtained by the regression analysis as a roughness index value of the pattern or a noise index value included in the signals.

15 Claims, 9 Drawing Sheets

(51) Int. Cl.
*G01N 23/2251* (2018.01)
*H01J 37/22* (2006.01)
*H01L 21/66* (2006.01)

(52) U.S. Cl.
CPC ..... *H01J 37/28* (2013.01); *H01J 2237/24578* (2013.01); *H01L 22/12* (2013.01)

(58) Field of Classification Search
CPC ............ G06T 1/00; G06T 2207/20016; G06T 2207/20036; G06T 2207/30164; G06T 7/12; G06T 7/13; G06T 7/155; G06T 7/181; G06T 7/521; G06T 7/75
USPC ........ 382/294, 199, 243, 298, 218, 248, 299
See application file for complete search history.

(56) References Cited

U.S. PATENT DOCUMENTS

| | | | |
|---|---|---|---|
| 8,150,213 B2* | 4/2012 | Kido | G06K 9/6857 |
| | | | 382/294 |
| 8,355,590 B2* | 1/2013 | Kido | G06K 9/6857 |
| | | | 382/243 |
| 2010/0034476 A1* | 2/2010 | Kido | G06K 9/6203 |
| | | | 382/243 |
| 2010/0034484 A1* | 2/2010 | Kido | G06K 9/6202 |
| | | | 382/294 |
| 2010/0098338 A1* | 4/2010 | Kido | G06T 1/00 |
| | | | 382/199 |
| 2010/0098339 A1* | 4/2010 | Kido | G06K 9/6253 |
| | | | 382/199 |
| 2016/0247287 A1* | 8/2016 | Inaba | G06T 7/13 |

* cited by examiner

FIG. 7
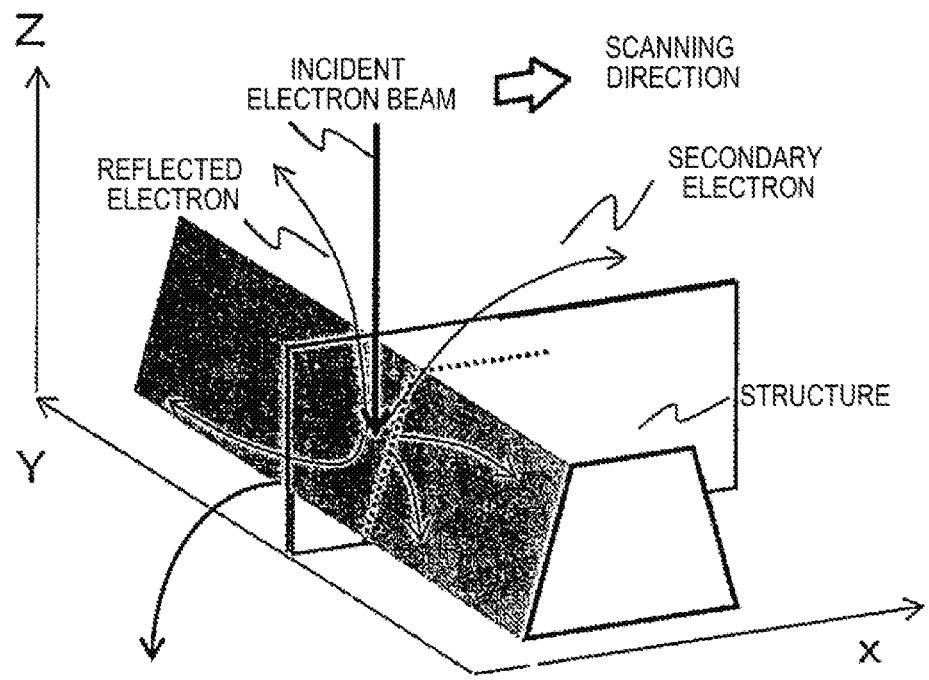
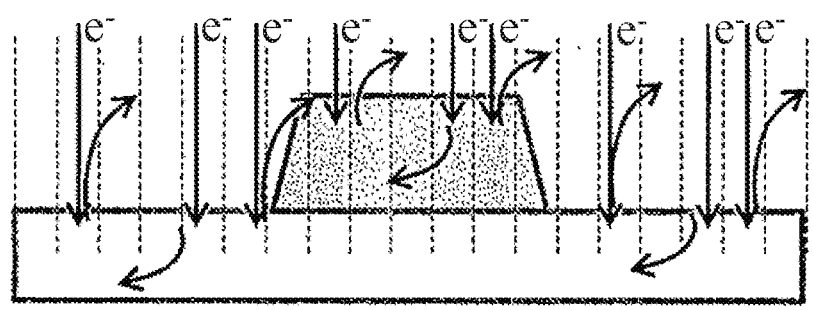
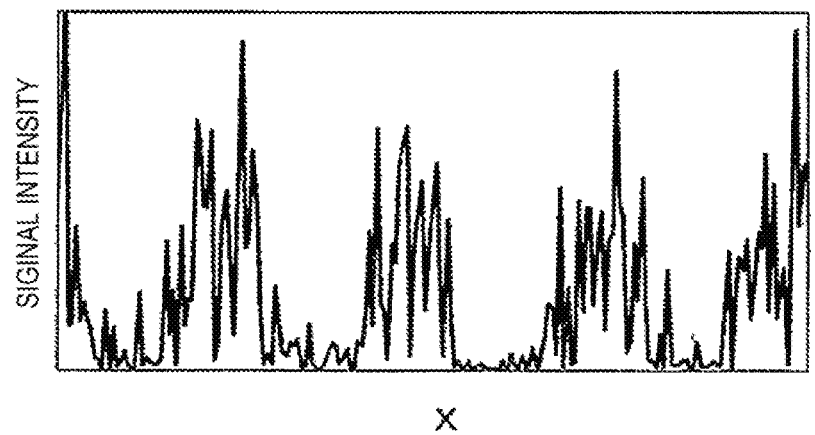

PATTERN MEASURING METHOD, PATTERN MEASURING APPARATUS, AND COMPUTER PROGRAM STORAGE DEVICE

TECHNICAL FIELD

The present disclosure relates to a pattern measuring apparatus formed on a semiconductor device, and the like, and a computer program instructing a computer to execute measurement processing, and more particularly to, a pattern measuring apparatus and a computer program for measuring an index value of a pattern such as a variation of a pattern shape, and the like with high accuracy regardless of noise, and the like accompanied by measurement.

BACKGROUND ART

As a semiconductor device is miniaturized, the importance of measurement and inspection using a scanning electron microscope (SEM) capable of visualizing a pattern having a width of a nanometer order has increased. In PTL 1, described is an evaluation method in which surface irregularity formed on a pattern side wall is evaluated by using a signal obtained by the SEM. The surface irregularity is referred to as line edge roughness (LER) or line width roughness (LWR). Since roughness has an influence on a characteristic of a circuit formed on a semiconductor device, it is required to appropriately perform an evaluation.

Further, in PTL 2, described is a method in which a plurality of times of measurement is performed based upon a plurality of times of beam scanning, and simultaneously, a line width before shrinkage (before beam irradiation) is estimated by extrapolation, so as to accurately measure a line width of a pattern formed by a material which is shrunk by irradiation of an electron beam such as an ArF resist.

CITATION LIST

Patent Literature

PTL 1: Japanese Patent No.-B 4801427 (corresponding U.S. Pat. No. 7,619,751)
PTL 2: Japanese Patent No. 3823117 (corresponding U.S. Pat. No. 7,285,777)

SUMMARY OF INVENTION

Technical Problem

When measuring roughness with high accuracy by using an image outputted from a measuring apparatus such as a scanning electron microscope, and the like, it is required to consider noise included in an image signal. True LER and measurement noise have respectively different spatial frequency characteristics, however, the spatial frequency characteristics of LER to be observed are mixed with the true LER and the measurement noise, thereby causing deterioration of measurement accuracy due to existence of the measurement noise. Solution to a mixture of noise having a frequency component is not disclosed in PTLs 1 and 2.

Hereinafter, proposed herein are a pattern measuring method, an apparatus, and a computer program which are aimed at specifying measurement noise having a frequency component, or deriving a roughness evaluation value from which the measurement noise is removed.

Solution to Problem

As one aspect for achieving the above-mentioned object, proposed herein are a method, an apparatus, and a computer program in which signals of a plurality of frames are acquired by scanning the beam a plurality of times on a pattern formed on a sample; a plurality of integration signals having the different number of integration are generated from the signals of the plurality of frames; edge position information of the pattern is obtained along an edge from the plurality of respective integration signals having the different number of integration; a difference between the edge position information and reference position information is obtained; a spectral component of a specific spatial frequency of the edge or a standard deviation is obtained based upon the difference; regression analysis in which a value relating to the number of integration is set as an explanatory variable, and a value relating to the spectral component or the standard deviation is set as a target variable is performed; and a value obtained by the regression analysis is outputted as a roughness index value of the pattern or a noise index value included in the signals.

Advantageous Effects of Invention

According to the above-mentioned configuration, it is possible to specify measurement noise having a frequency component, or to derive a roughness evaluation value from which the measurement noise is removed.

BRIEF DESCRIPTION OF DRAWINGS

FIG. 7 is a diagram illustrating generation principle of measurement noise in a scanning electron microscope (SEM).

DESCRIPTION OF EMBODIMENTS

Figure 1:
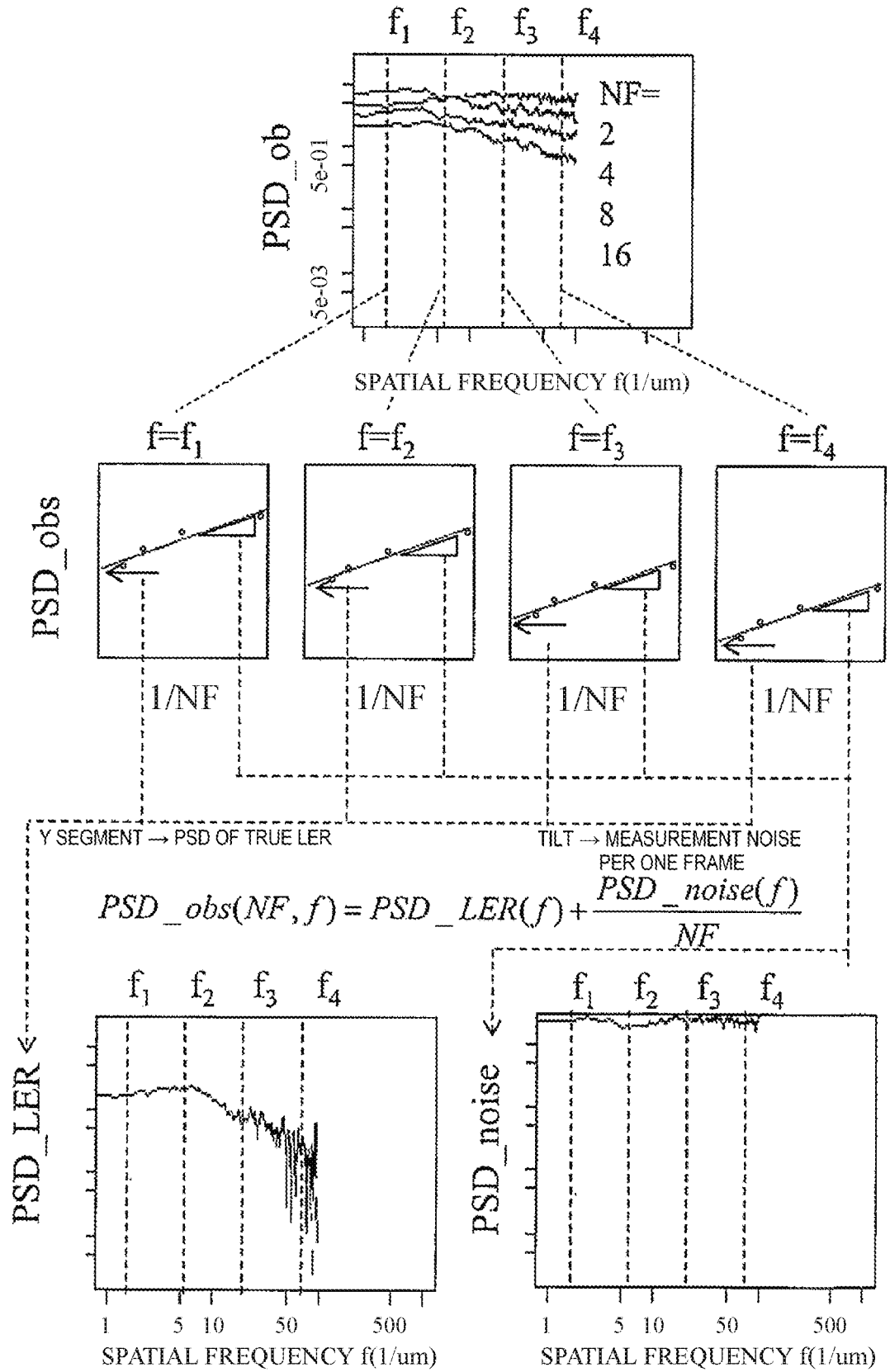
FIG. 1 is a diagram illustrating a process of performing operation of power spectral density (PSD) of true LER and measurement noise.

Along with miniaturization of a circuit line width of a semiconductor integrated circuit, it has been urgent to take measures against a deviation from a design position of an edge position of a circuit pattern actually formed on a wafer, a so-called Edge Placement Error (EPE). It is a rate limiting factor of the reduction of the line width that the EPE cannot be sufficiently prevented. For example, in a state-of-art logic device, various rectangular patterns beyond a resolution limit of an exposure device are formed by overlapping a simple L/S pattern of ultra-fine pitch manufactured by a sidewall assist method with a long-thin hole or a long-thin island pattern extending in a direction perpendicular to the L/S edge.

At this time, a tip of the long-thin hole or the long-thin island pattern should exist at a space of the L/S or a center of a line. However, since an edge position of the L/S and a tip position of the long-thin hole (island) are varied, an allowable value of a deviation determines a fine pitch limit. That is, a pitch reduction limit in an element design rule is set in such a manner that a processing variation represented by the LER is rate-limited. Therefore, the pitch reduction limit is required to be accurately measured.

The LER includes fluctuations of various spatial periods in an edge direction. Generally, for example, a dimensional fluctuation of a period longer than an element dimension (a low frequency) causes a variation of the element dimension, and thus, causes a variation of element performance (for example, a threshold voltage of a MOS transistor, and the like). Meanwhile, a dimensional fluctuation of a period shorter than the element dimension (a high frequency) causes the variation of the element dimension, and thus, causes deterioration of element performance (for example, a leakage current of the MOS transistor). Particularly, now, three-dimensionalization of the element has been in progress in parallel with miniaturization of the element, and the element performance becomes sensitively dependent on a planar local dimension, thereby causing a significant performance variation due to the LER fluctuation in a higher spatial frequency region. Therefore, in order to evaluate an influence thereof, it is important to obtain a spatial frequency characteristic of the LER.

The LER is generated by a process of a resist polymer material used for processing, shot noise at the time of pattern exposure, movement of plasma at an etching process, and the like. Since the above-mentioned occurrences are phenomena independent of design dimension reduction of a circuit pattern caused by progress of processing technology, the occurrences cannot be necessarily reduced in proportion to a design rule. In order to solve the occurrences, a resist material having a smaller line edge roughness, a phenomenon processing method, and an etching method have been developed, however, it is required to measure a spatial frequency characteristic of the line edge roughness in evaluating effectiveness thereof.

However, there exists a case in which it is difficult to accurately measure true LER due to a measurement error when detecting an edge. Particularly, in the spatial frequency characteristic measurement, the true LER and measurement noise have respectively different spatial frequency characteristics, however, a spatial frequency characteristic of LER to be observed is mixed with both the true LER and the measurement noise, such that it becomes difficult to obtain the spatial frequency characteristic of the true LER by separating both the true LER and the measurement noise. For example, when noise is so dominant that the true LER is buried, it is difficult to measure the true LER. In contrast, when the noise is smaller than the true LER, an influence of the noise cannot be found out. Further, the true LER frequently represents a characteristic close to 1/f, whereas the measurement noise is frequently so-called white noise. It is frequently possible to distinguish both the true LER and the measurement noise according to the above-mentioned difference in the frequency characteristics. However, when the true LER and the noise are almost same, it becomes difficult to accurately separate both the true LER and the measurement noise.

A main factor of the measurement error is particle properties of an electron. FIG. 7 schematically illustrates principle of edge position measurement of a line pattern by an SEM. Generally, a focused electron beam is scanned in a direction (an x direction) perpendicular to an edge direction (a y direction), and then a generated secondary electron and backscattered (reflected) electron emitted from a sample are detected, after which a relationship between an irradiation position of an electron beam (an x coordinate) and a detection signal is plotted, thereby obtaining a signal intensity profile. However, respective processes such as electron emission from an electron source, scattering of the electron incident on an inside the sample, emission of the secondary electron, generation of the backscattered electron, and the like are stochastic processes, and thus consequently, the signal intensity profile varies. Therefore, an edge position obtained from the above-mentioned profile also varies.

In embodiments described hereinafter, a method, an apparatus, and a computer program for selectively obtaining true LER from which noise is removed or a noise component included in LER will be described.

In the embodiment described hereinafter, described herein are a measuring method, an apparatus, and a computer program in which a plurality of integrated images having the different number of integrated frames is mainly generated based upon signals obtained based upon a plurality of frame scans on a sample; frequency characteristics of edges included in the plurality of integrated images are operated; regression analysis is performed on the number of the integrated frames for each frequency component; and an evaluation value of roughness is operated for each frequency component based upon extraction of a parameter (for example, $\sigma^2$) corresponding to a segment of a regression line, or measurement noise is operated for each frequency component from a parameter corresponding to a tilt of the regression line.

More specifically, a plurality of images having the different number of frames NF with respect to a circuit pattern on a semiconductor wafer are obtained by using the SEM, and then a deviation with respect to a reference position of a circuit pattern edge (a design edge) is obtained for the respective images obtained from the different number of frames. When a longitudinal direction of the edge is a Y direction, a deviation for each different Y coordinate is obtained. Roughness (LER) is obtained from the deviation of each Y coordinate, and spatial frequency spectral density (PSD) of the LER is operated. Next, a model (function), in which a value relating to each frame number is set as an explanatory variable (in the embodiment, a reciprocal of the frame number) and a value relating to a spectral component (intensity) of the same frequency is set as a target variable, is generated, after which regression analysis (extrapolation) using the model is performed. A segment obtained by the regression analysis is theoretically a spectral component obtained by maximizing the number of the frames and can be defined as a value which is acquired in a state where a noise component is minimized. Accordingly, it is possible to describe an estimated spectral component acquired at each frequency as a power spectrum of true LER without noise by representing the estimated spectral component as intensity per a spatial frequency.

Here, a component not depending on the number of the frames is defined as a spatial frequency characteristic of a true variation, and a component depending thereon is defined as a spatial frequency characteristic of measurement noise.

According to the method as described above, it is possible to reduce a chip area by obtaining a spatial frequency characteristic of true line edge roughness by separating the noise, for example, by estimating more accurate pitch miniaturization limit. Further, performance and production yield of a semiconductor device are improved by developing a resist material having smaller line edge roughness, a phenomenon processing method, and an etching method.

Hereinafter, a measuring apparatus for measuring a pattern formed on a semiconductor device, a computer program for instructing a computer to execute pattern measurement, and a storage medium for storing the computer program will be described with reference to the drawings in which embodiments of the present invention are shown.

In the embodiment described hereinafter, a charged particle beam device provided with a computation device for executing pattern measurement with high accuracy will be described. Further, the charged particle beam device described hereinafter is controlled by a controller including a computer processor and a non-transitory computer readable medium. When a program stored in the non-transitory computer readable medium is executed by the computer processor, the program is encoded by a computer instruction that instructs a system controller to execute predetermined processing and performs control and measurement processing of the charged particle beam device according to processing steps to be described later.

Figure 5:
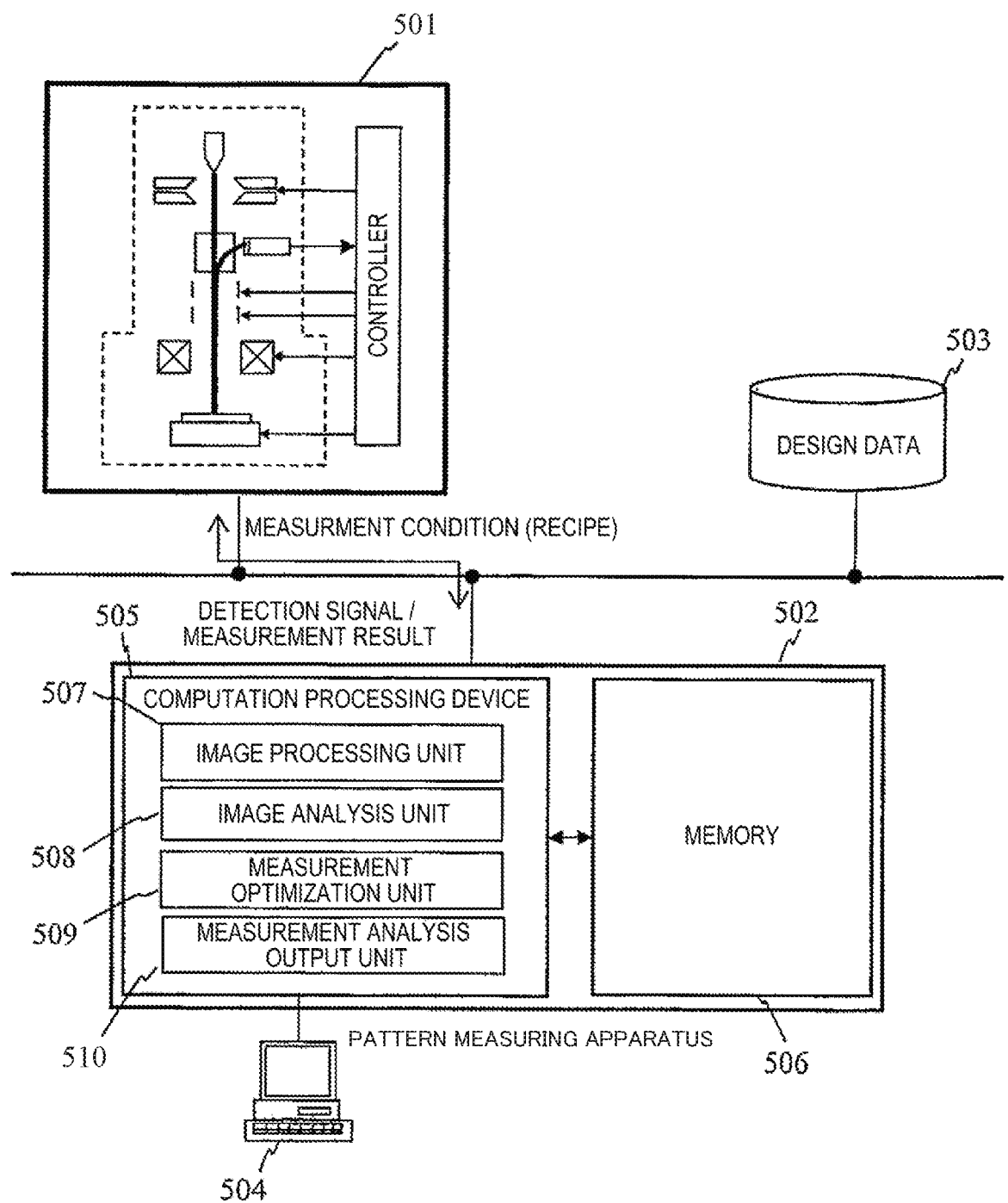
FIG. 5 is a diagram illustrating one example of a semiconductor measurement system.

FIG. 5 is a diagram illustrating one example of a measuring system including a pattern measuring apparatus 502 that measures a pattern based upon a measurement result obtained by an SEM 501. Further, FIG. 5 illustrates an example in which the SEM 501, which is an image capturing system, and a computation processing device 505 (a pattern measuring apparatus 502) that executes measurement processing based upon a detection signal are connected to each other via a network. However, the present invention is not limited thereto. For example, an image processing unit 618 included in a scanning electron microscope illustrated in FIG. 6, which will be described later, may perform computation processing to be described later.

The system illustrated in FIG. 5 includes the SEM 501; the pattern measuring apparatus 502 that performs pattern measurement, and the like based upon an obtained signal; a design data storage medium 503 that stores data layout data generated based upon design data of the semiconductor device, or design data; and an input device 504 provided with a display unit.

Figure 6:
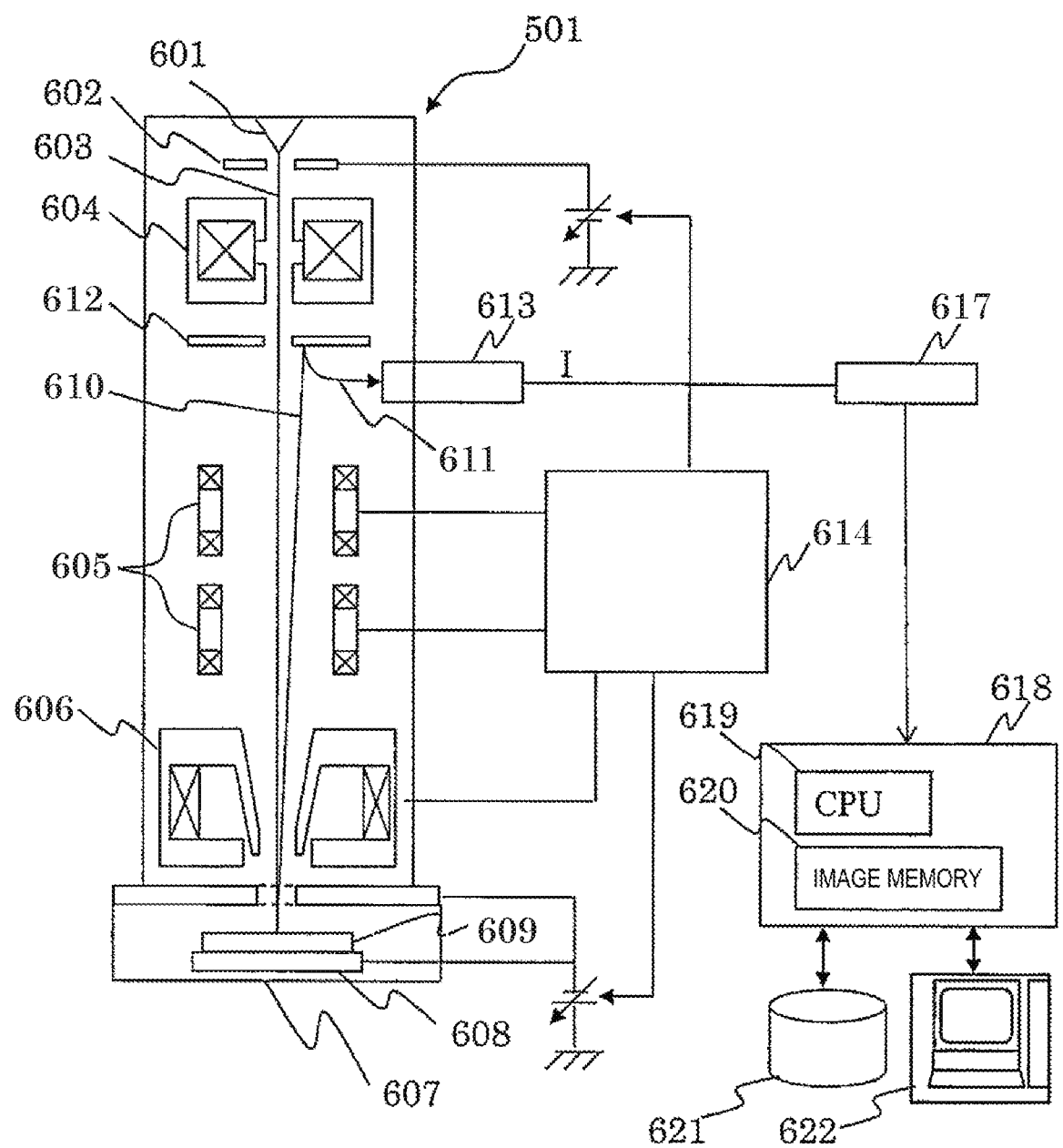
FIG. 6 is a diagram illustrating an outline of a scanning electron microscope (SEM).

FIG. 6 is a diagram illustrating an outline of the SEM 501. An electron beam 603 is extracted from an electron source 601 by an extraction electrode 602, and the electron beam is accelerated by an acceleration electrode (not shown). The accelerated electron beam 603 is condensed by a condenser lens 604 which is one form of focusing lenses, after which the accelerated electron beam is deflected by a scanning deflector 605. Accordingly, the electron beam 603 is one-dimensionally or two-dimensionally scanned on a sample 609. The electron beam 603 incident on the sample 609 is decelerated by a negative voltage that is applied to an electrode built in a sample stand 608 and is focused by lens action of an objective lens 606, thereby being irradiated on a surface of the sample 609.

An electron 610 (secondary electron, backscattered electron, and the like) is emitted from an irradiated portion on the sample 609. The emitted electron 610 is accelerated in a direction of the electron source 601 by acceleration action based upon the negative voltage that is applied to the electrode built in the sample stand 608. The accelerated electron 610 collides with a conversion electrode 612 and generates a secondary electron 611. The secondary electron 611 emitted from the conversion electrode 612 is captured by a detector 613, and an output I of the detector 613 changes according to an amount of the captured secondary electron. Luminance of a display device changes according to the change of the output I. For example, when forming a two-dimensional image, a deflection signal to the scanning deflector 605 and the output I of the detector 613 are synchronized with each other, thereby forming an image of a scanning region.

Further, the SEM illustrated in FIG. 6 shows an example of detecting the electron 610 emitted from the sample 609 by partially converting the electron 610 into the secondary electron 611 in the conversion electrode 612, however, the present invention is not limited to the above-mentioned configuration. For example, a configuration in which detection surfaces of an electron multiplying image tube and a detector are arranged on an orbit of the accelerated electron may be adopted. A controller 614 supplies necessary control signals to respective optical elements of the SEM according to an operation program for controlling the SEM which is referred to as an imaging recipe.

The signal detected by the detector 613 is converted into a digital signal by an A/D converter 617 and is transmitted to an image processing unit 618. The image processing unit 618 integrates signals obtained by a plurality of scans in a frame unit, thereby generating an integrated image.

Here, an image obtained by scanning the scanning region one time is referred to as an image of one frame. For example, in the case of integrating images of eight frames, an integrated image is generated by performing addition averaging processing on signals obtained by two-dimensional scanning of eight times in a pixel unit. It is possible to generate and store a plurality of images having each image of one frame for each scanning by scanning the same scanning region a plurality of times.

Further, the image processing unit 618 includes an image memory 620 which is an image storage medium for temporarily storing a digital image; and a CPU 619 which operates characteristic amounts (dimensional values of a line and a hole width, a roughness index value, an index value indicating a pattern shape, an area value of a pattern, a pixel position becoming an edge position, and the like) from the image stored in the image memory 620.

Further, provided is a storage medium 621 that stores measurement values of respective patterns, luminance values of respective pixels, and the like. Overall control is configured in such a manner that operation of a required device and confirmation of a detection result, and the like, all of which are performed by a workstation 622, are realized by a graphical user interface (hereinafter referred to as GUI). Further, the image memory is configured to be synchronized with a scanning signal supplied to the scanning deflector 605 and to store an output signal of the detector (a signal proportional to an electron amount emitted from a sample) in an address (x, y) on a corresponding memory. Further, the image processing unit 618 generates a line profile from a luminance value stored in the memory, specifies an edge position by using a threshold method, and the like and also functions as the computation processing device that measures a dimension between the edges.

The SEM that performs dimension measurement based upon such line profile acquisition is referred to as a CD-SEM and is used for measuring various characteristic amounts as well as line width measurement of a semiconductor circuit. For example, surface irregularity referred to as the line edge roughness exists on an edge of the circuit pattern, which becomes a factor causing a change in circuit performance. The CD-SEM can be used for the measurement of the LER.

The LER is operated by converting a deviation degree of an actual edge position with respect to an average position of an edge position in an x-direction (for example, a scanning line direction of the electron beam) into an index value.

Hereinafter, a method for obtaining the spatial frequency characteristic of the LER based upon the detection signal obtained by the SEM will be specifically described.

First Embodiment

Figure 2:
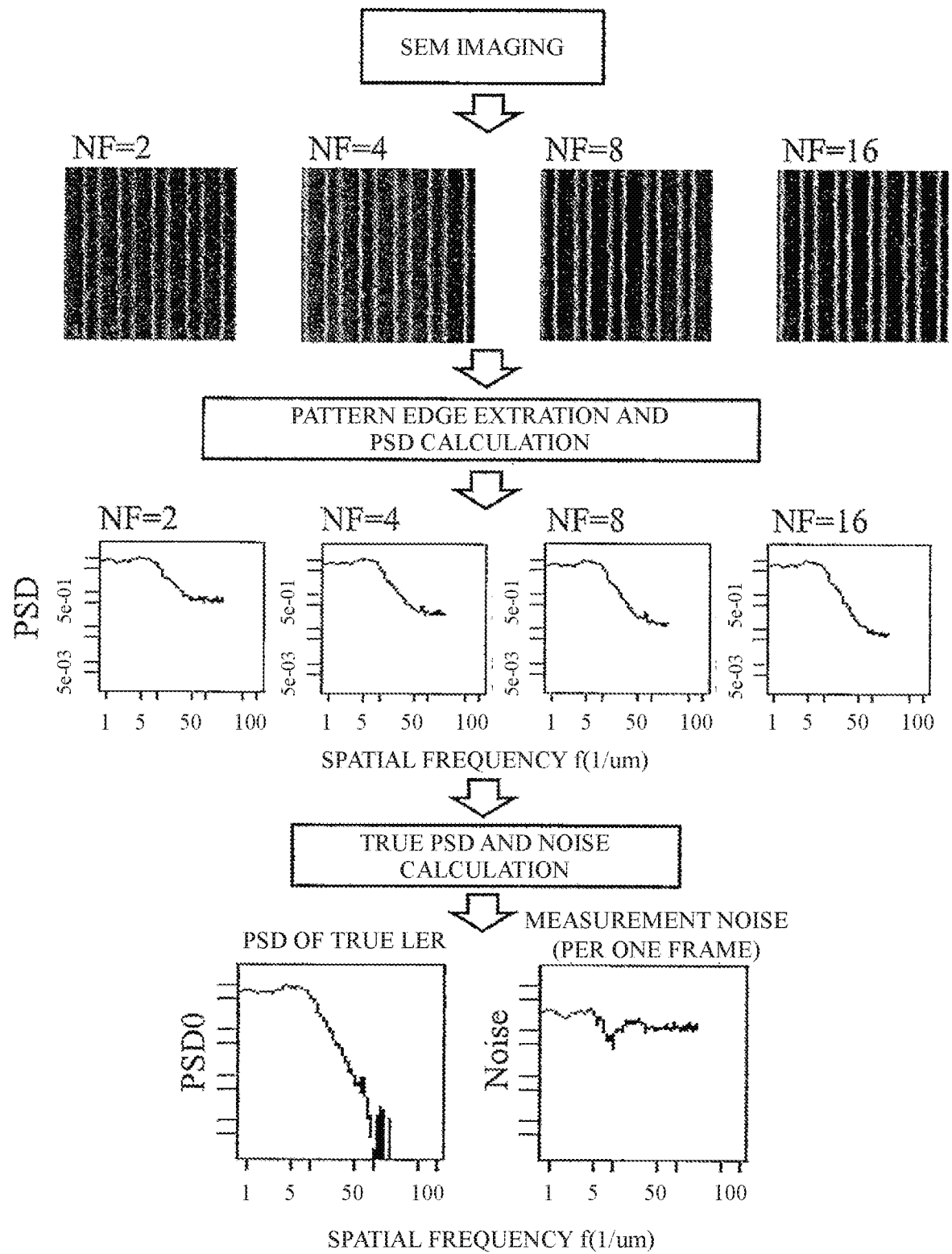
FIG. 2 is a diagram illustrating a process of a method for operating a spatial frequency characteristic of LER.

FIG. 2 is a diagram illustrating a procedure for obtaining the spatial frequency characteristic of the LER. A plurality of images P (NF) having the different number of frames NF (for example, NF=2, 4, 8, 16) are acquired with respect to the same region on the wafer. Next, with respect to each of the plurality of images, an edge of an image pattern of a structure (for example, a resist line pattern, and the like) on the wafer corresponding to a predetermined design pattern is detected, and a point sequence of a deviation from a design pattern position of the detected edge position and the standard deviation, that is, LER_obs(NF) are obtained.

In order to obtain a deviation from a reference position of the edge, for example, a luminance profile is generated at a y-coordinate set as a sampling point from image data in a measurement region including the edge according to a set data extraction start point and a sampling interval, and X-coordinate data corresponding to an edge position from the profile is operated. Next, the operated X-coordinate data is moved in a y direction and operated according to the set sampling interval, and data point sequence of the edge roughness in the measurement region {Δxi: Δx1, Δx2, ... } or {wi: w1, w2, ... } is acquired.

Next, the respective point sequences are Fourier-converted and a spatial frequency spectrum of the LER, that is, power spectral density PSD_obs(NF, f) is obtained.

Here, f is a spatial frequency. A method, in which a plurality of images having various numbers of the frames is acquired and the PSD with respect to each of the plurality of images is obtained, will be described later by using FIG. 3. Next, power spectral density PSD_LER (f) of the true LER and a measurement noise component PSD_noise(f) are separated from the power spectral density PSD_obs(NF, f) obtained from a different number of a plurality of frames NF. The above-mentioned separation method will be hereinafter described with reference to FIG. 1.

FIG. 1 is a diagram schematically illustrating a part for performing operation of true PSD and noise in FIG. 2. The power spectral density PSD(NF, f) obtained from the respective number of frames NF is fitted to [Equation 1] for each frequency f with respect to the number of frames NF. Fitting can use normal linear regression. FIG. 1 illustrates only four frequencies from f1 to f4 for the descriptions, however, in fact the fitting is performed on all points of the spectrum of the PSD.

$$PSD\_obs(NF, f) = PSD\_LER(f) + PSD\_noise(f)/NF \quad (1)$$

Here, in each frequency f, PSD_LER(f) is a component not depending on the number of the frames, whereas PSD-noise(f) is a proportional constant of a component inversely proportional to the number of the frames. Each frequency component of the observed spectrum can be fitted to $R^2 > 0.95$ in the Equation 1. In the embodiment, PSD_LER(f) is defined as a spatial frequency characteristic of a true variation, and PSD_noise(f) is defined as a spatial frequency characteristic of measurement noise per one frame. Further, a value of the true LER within a predetermined spatial frequency range is obtained according to an Equation 2 from the PSD_LER(f) obtained in this manner. However, integration described below is performed within the predetermined spatial frequency range.

$$LER = \sqrt{(\int PSD\_LER(f) df)} \quad (2)$$

Figure 3:
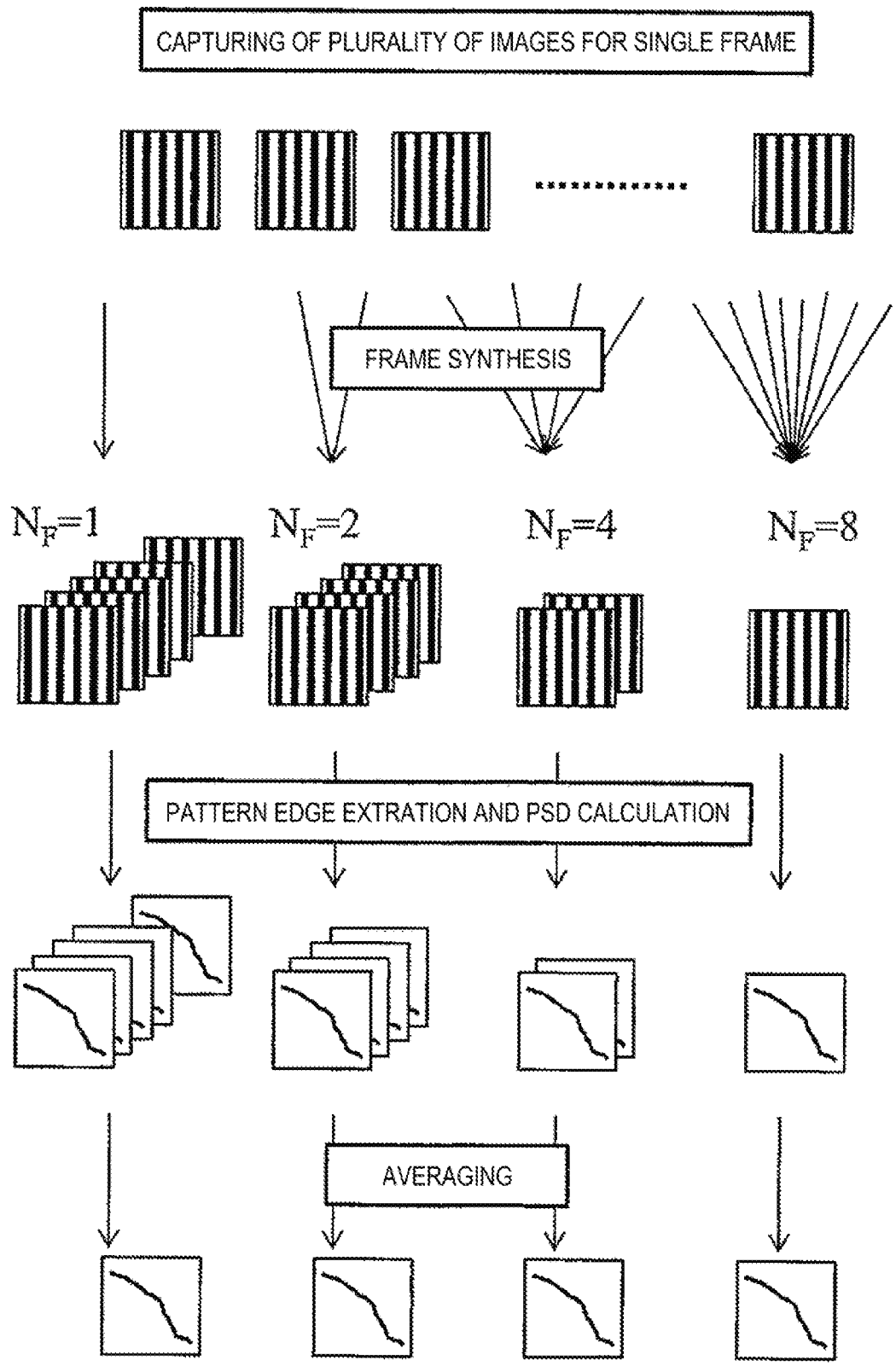
FIG. 3 is a diagram illustrating a process of generating a plurality of integrated images having the different number of integrated frames from image signals of a plurality of frames, and of performing PSD analysis on the respective images.

Next, a method for acquiring a plurality of frame images and the PSD will be described with reference to FIG. 3. In a normal procedure, when acquiring a plurality of frame images, the images of respective number of the frames are separately acquired. In this case, the number of the frames required for acquiring the necessary whole images is the sum of all number of the frames, and when it takes time to acquire the images, or an irradiation amount becomes excessive, it is a problem that damage to the sample occurs by the electron beam, thereby changing measurement results (particularly, in the case of an organic material such as resist, and the like, contraction or shrinkage of a pattern and the like occur). Here, the number of the frames corresponding to the required maximum number of the frames is acquired for a single frame image, and the acquired frames are synthesized to generate a plurality of images having variously different numbers of the frames NF. Specifically, the same region on the wafer is scanned NFmax times (for example, eight times) and the images are read for the respective scans, and a single frame image Ps(i) (i=1 to 8) of NFmax (eight frames) is acquired. In this case, an image format corresponding to a multi-page may be also used.

Next, a plurality of images having the different number of frames NF is synthesized from the plurality of single frame images. For example, images having the number of two frames are generated by Ps(1)+Ps(2), Ps(3)+Ps(4), ... and the like, and images having the number of four frames are generated by Ps(1)+Ps(2)+Ps(3)+Ps(4), ... and the like.

A type of the integrated image generated from the plurality of single frame images (frame images before integration) can be obtained by computing nCr (n is the number of the frames and r is the number of the integrated frames). For example, in a state where image data having eight frames exist, the generatable type of the integrated image having the number of two integrated frames is $_8C_2=28$. In the same manner, the combination of the number of three integrated frames and the number of four integrated frames also can be obtained. The images are generated for such the combination and an average thereof is obtained, such that it is possible to prevent a variation of each measurement. Meanwhile, since the same single frame image is redundantly used, this method has a lot of waste. Here, in order to prevent a single frame image to be used from being redundantly used, images having the number of the integrated images having the number of two integrated frames (3, 4, ... ) and 8/2=4 (Inf (8/3)=2, 8/2=2, ... ) are generated from among eight single frame images, thereby desirably obtaining an average thereof. However, INT represents decimal point truncation. Accordingly, while preventing the electron beam irradiation amount to a minimum, a plurality of images Pj(NF) (j=1 to m (NF)) can be acquired with respect to the different number of a plurality of frames NF (NF=1 to NFmax, or NF=2, 4, 8).

Next, pattern edges are detected in the above-mentioned respective images. In this case, a waveform matching method is used in the edge detection. A reference waveform in waveform matching is obtained by averaging a plurality of waveform profiles obtained along different scanning lines. Alternatively, an analysis equation may be used. The waveform matching method, for example, compares a waveform signal extracted from an image signal with a reference signal waveform, after which an edge position is specified based upon an evaluation of a coincidence degree between the waveform signal and the reference signal waveform. Further, an edge detection method is not limited to the above-mentioned method, and a so-called threshold method, and the like may be used. In the embodiment, the edge can be detected stably even when the number of the frames is small by using the waveform matching method.

In the method using information having a low frame image, it is desirable that the waveform matching is used. However, when compatibility with a measuring apparatus adopting a normal threshold method, and the like, is emphasized, the method is not limited thereto. Further, in normal edge detection, smoothing (or filtering) of a signal is performed in a beam scanning direction or an edge direction. Here, the smoothing is performed by moving average of five pixels in the beam scanning direction. Further, the smoothing is frequently performed in the edge direction even with respect to the detected edge position, however, since the above-mentioned smoothing may change the true LER changing for each neighboring scan line, the smoothing is not performed in the embodiment.

Next, edges are linearly approximated along the respective pattern edges by using a predetermined method, and a distance (a deviation of an edge coordinate) from each edge point to the approximate straight line is obtained at a fixed interval on the approximate straight line along the edges, thereby obtaining a deviation array. A standard deviation of the deviation array is the so-called LER. Further, here, for example, the above-mentioned region is set to include about ten line and space of 50 nm pitch formed by an EUV exposure method, and the point sequence is obtained with respect to each of a total of twenty left-and-right edges of the line pattern included in each image.

Next, the power spectral density with respect to the deviation array is obtained. Here, a multitaper method is used. The multitaper method is described in the following literature: Percival D B and Walden A T (1993) Spectral Analysis for Physical Applications: Multitaper and Conventional Univariate Techniques. Cambridge University Press, Cambridge, UK.

The power spectral density is obtained from each of the plurality of line edges included in an image acquisition region, and an average of the power spectral density obtained therefrom is obtained, after which power spectral density PSDj(NF, f) with respect to the image Pj(NF) is defined. Further, the power spectral density of a plurality of images with respect to the same NF is averaged, and the power spectral density PSD_obs(NF, f) with respect to a specific NF is obtained. Here, f is a spatial frequency along the edges.

According to the method described above, even when the noise component in the power spectrum is not clear, the spatial frequency spectrum of the true LER can be obtained.

Figure 8:
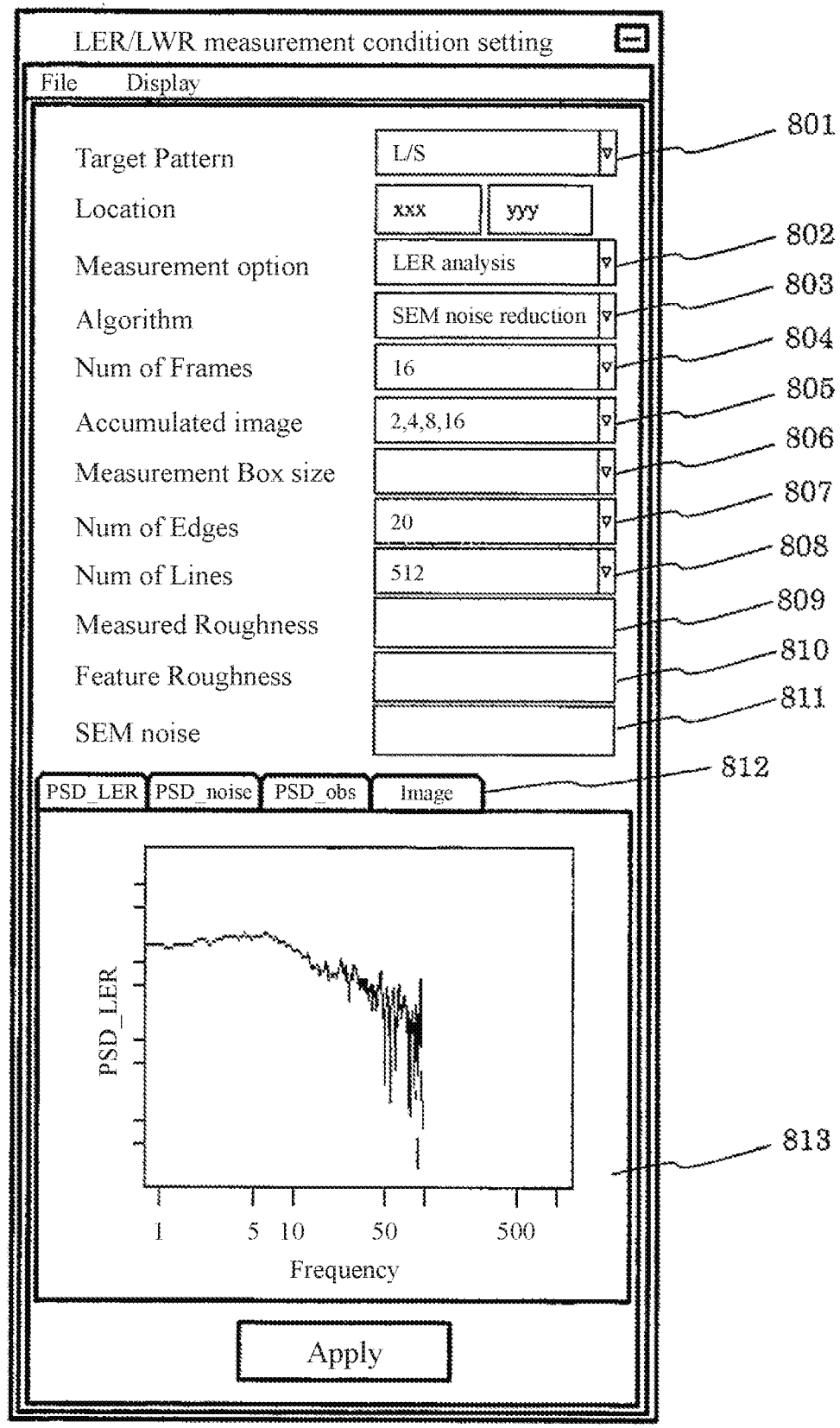
FIG. 8 is a diagram illustrating one example of a GUI screen for setting a condition when LER measurement is performed.

FIG. 8 is a diagram illustrating one example of a GUI screen displayed on display devices of an input device 504 and a workstation 622. The GUI screen can set a measurement condition or a device condition of the scanning electron microscope. First, when the GUI screen is used as a measurement condition setting device, image signals of a plurality of frames are acquired in advance, and image processing and computation are executed based upon parameter selection as illustrated in FIG. 8.

The GUI screen illustrated in FIG. 8 includes a target pattern selection window 801 and a measuring method selection window 802. The line and space (L/S) is selected in the target pattern selection window 801 and LER analysis is selected in the measuring method selection window 802. Further, in a measurement algorithm selection window 803, measurement noise (SEM noise) reduction algorithm is selected and is set to perform image processing and computation processing for executing an LER measuring method using the method described above. Based upon such the above-mentioned setting, the computation processing device 505 and the CPU 619 execute the measurement processing accompanied by measurement noise removal.

Further, since the integrated images having a plurality of different number of frames are required to perform the measurement noise removal described above, a window 804 for setting the number of required frames and a window 805 for setting the integrated images used for the regression analysis are provided on the GUI screen, by which the measuring method is selected, as shown in FIG. 8. For example, in a state where images for measurement are already acquired, the number of the acquired frames is displayed on the window 804 for setting the number of the required frames, and the type of the integrated images which can be formed by the acquired frames is set on the window 805 for setting the integrated images. On the GUI screen illustrated in FIG. 8, image data including sixteen frames exist, and the window 805 is set to form the integrated images of two frames, four frames, eight frames, and sixteen frames. When the image data of sixteen frames exist in advance, for example, a combination of the integrated images which can be formed by sixteen frames may be displayed as a pull-down menu of the window 805 and an operator may select an arbitrary combination.

When performing the regression analysis, measurement with high accuracy can be performed when many pieces of information for forming a model are provided, meanwhile, in consideration of the damage to the sample caused by throughput of the measurement and beam irradiation, it is desirable to form an image with a small number of frame scans and to perform the measurement thereof. Here, when the measurement result can be evaluated while changing the combination of the integrated images, it is possible to find out a measurement condition that is compatible with the measurement accuracy and the small number of the frame scans. For example, when the regression analysis can be appropriately performed only by the integrated images of two frames, four frames, and eight frames, required information can be acquired only by performing the scanning of eight frames, thereby making it possible to determine that the scanning of sixteen frames is not required.

Further, the embodiment shows an example in which the integrated images of two frames, four frames, eight frames, and sixteen frames are generated from image data of sixteen frames (two-dimensional scanning of sixteen times), but the embodiment is not limited thereto. For example, the integrated images of the above-mentioned four types may be generated from image data of thirty frames (=2+4+8+16). However, in consideration of the measurement throughput, and the like as described above, since it is desirable to acquire necessary information with a small number of the frames, it is desirable to be set as (the number of the frames required for generating the integrated images having the maximum number of integration=the number of frames acquired).

Further, the GUI screen illustrated in FIG. 8 is provided with a window 806 for setting a size of a measurement box showing a region which becomes a measurement object in a field of view; a window 807 for setting the number of edges included in the measurement box; and a window 808 for setting the number of scanning lines in the measurement box. The above-mentioned setting windows mainly set device conditions of the scanning electron microscope.

Further, the GUI screen illustrated in FIG. 8 is provided with a display frame 809 for displaying a measured roughness value before performing noise removal processing; a display frame 810 for displaying a true roughness value (a roughness value faithfully reflecting a structure of a pattern edge without noise) appearing by the noise removal processing using the method described above; and a display frame 811 for displaying the measurement noise obtained by the method described above. Further, the GUI screen is provided with a display frame 812 for displaying the power spectrum and the SEM image obtained as described above, and a tag 811 for selecting the information to be displayed on the display frame 812. The measurement results are displayed on the GUI screen by executing the above-mentioned computation in the computation device and outputting the results on the display device.

Since evaluation of the measurement results based upon the setting of the measurement conditions can be performed by adopting the GUI screen illustrated in FIG. 8, it is possible to perform the setting of the appropriate measurement conditions and the appropriate measurement based upon the setting of the appropriate measurement conditions.

Second Embodiment

In the embodiment, described herein is a method for obtaining dispersion σ of an edge position point sequence which is one of the roughness index values. In the embodiment, described herein is an example in which a pattern formed by a Self-Aligned Quadruple Patterning (SAQP) method is defined as a measurement object.

Figure 4:
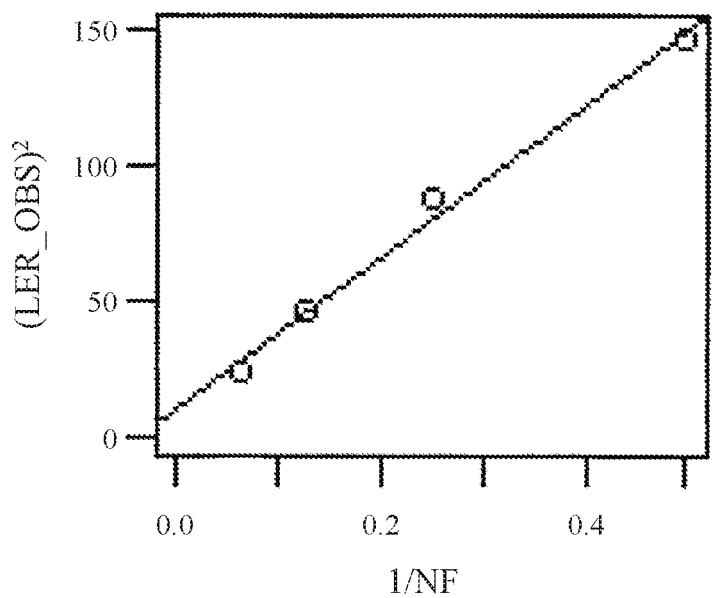
FIG. 4 is a diagram illustrating a relationship between dispersion of LER (edge position point sequence) obtained from a plurality of images having the various numbers of frames and a reciprocal of the number of frames.

First, images of a plurality of frames (in the case of this example, sixteen frames) are acquired by scanning the beams a plurality of times on an SAQP pattern. Next, the integrated images of the number of frames NF=2, 4, 8, and 16 are generated, and the dispersion of the edge position point sequence σ2 (2), σ2 (4), σ2 (8), σ2 (16) is obtained from the respective integrated images, and then plotted with respect to 1/NF, thereby obtaining the straight line as described in FIG. 4.

The straight line is fitted to [Equation 3], thereby obtaining a true value LER0 of the LER and measurement noise "Noise".

$$\sigma2(NF)=LER02+Noise2/NF \quad (3)$$

The LER02 obtained as described above coincides with the value of the LER obtained by integrating PSD0 in the first embodiment. When it is not required to obtain the spatial frequency characteristic, a dispersion value of the LER may be fitted as described in the embodiment.

Figure 9:
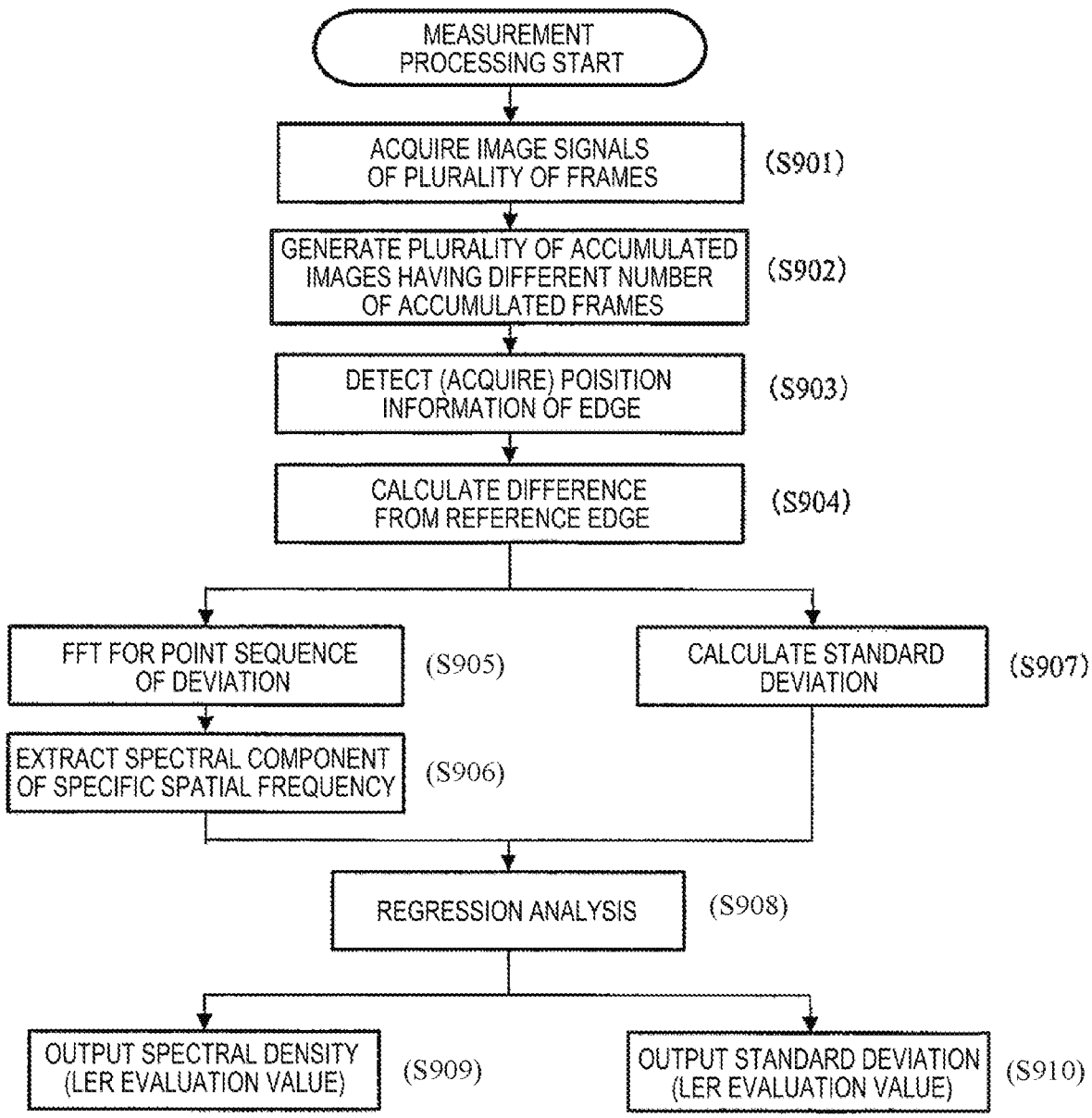
FIG. 9 is a flowchart illustrating a process of operating an LER evaluation value.

FIG. 9 is a diagram illustrating a difference between the processing of the first embodiment and the second embodiment. In the first embodiment and the second embodiment, the steps from S901 to S904 are the same as follows: the image signals of the plurality of frames are acquired (S901); the plurality of integrated images having the different number of integrated frames is generated (S902); the position information of the edge is detected (S903); and the difference between the detected edge position and the reference position is obtained (S904).

In the first embodiment, Fourier transform is performed on the point sequence (S905); after obtaining the power spectral density, the spectral components are extracted from each of the plurality of spatial frequencies (S906); and the regression analysis is performed on the respective spatial frequencies (S908), whereas in the second embodiment, the standard deviation is operated with respect to the deviation (S907); and the regression analysis is performed based upon the result thereof in a different manner as that of the first embodiment.

Further, in the first embodiment, the spectral component for each spatial frequency component or the tilt obtained by the regression analysis is plotted, thereby obtaining and outputting the power spectral density of a predetermined spatial frequency range (S909), whereas, in the second embodiment, the standard deviation obtained based upon the result of the regression analysis is outputted (S910) in a different manner as that of the first embodiment.

Third Embodiment

When the same method as that of the second embodiment is applied to a resist pattern, a slightly upwardly convex curve is obtained. When looking at CD measurement values and SEM images according to the number of the respective frames, it is found out that as the number of the frames increases, CD decreases, and a resist surface is smoothened. What is described above is considered to be caused by alteration of a material by the electron beam irradiation. That is, there exists a high possibility that the LER obtained from a high frame image (particularly, the high spatial frequency component) is smaller than actual LER. Here, the fitting in the first embodiment or the second embodiment is performed by using the image having the small number of the frames. Here, when synthesizing the plurality of frame images from the plurality of single frame images shown in the first embodiment, it is desirable to synthesize images captured as early as possible. Accordingly, it is possible to obtain the true LER in which an influence of resist shrinkage is prevented.

Fourth Embodiment

According to the result of the first embodiment, it is found out that the measurement noise of the LER is almost constant without depending on the spatial frequency, that is, the measurement noise is so-called white noise. On the other hand, when similar analysis is performed on the resist, the shrinkage of which is significant, it is found out that the measurement noise becomes large in a high frequency region. With respect to the reason described above, it is thought that since the roughness of the resist surface is smoothened by the electron beam irradiation when the number of the frames is large, a decrease in a high frequency component due to the increase in the number of the frames is excessively estimated. That is, a high frequency region is easy to be influenced by damage by the electron beam irradiation.

Here, in the embodiment, the true PSD is estimated by selectively specifying a measurement result from a low frequency region to a middle frequency region as a fitting object, obtaining an average of measurement noise obtained from a fitting result, and subtracting the average thereof from a whole frequency region as the measurement noise without depending on the frequency.

Accordingly, it is possible to obtain the true LER in which the influence of the resist shrinkage is prevented.

Fifth Embodiment

In the first embodiment, the waveform matching is used for edge detection, and edge smoothing in the edge direction is not performed. However, in the measuring apparatus adopting the normal threshold method, and the like, the edge smoothing in the edge direction is frequently performed on the edge detected by the threshold method. Thus, in the embodiment, the edge detection is performed by using the threshold method.

The waveform matching method is strong (robust) against noise such as measurement noise, and the like, and the waveform matching method is capable of relatively and stably detecting the edge even from an image having a small beam current or the small number of the frames. However, in the threshold method, in a case where the beam current or the number of the frames is small, when the edge smoothing is not performed in the edge direction, it is frequently difficult to detect the edge itself. Here, in the embodiment, the edge smoothing is performed by the moving average of four neighboring edges in the edge direction. Accordingly, an edge point sequence by images of the number of the frames two, three, four, five, and six and PSD with respect to the respective images of the number of the frames two, three, four, five, and six are obtained, and the true LER and the measurement noise are separated in the same manner as that of the first embodiment. The true LER obtained by the embodiment is a value with respect to the edge position point sequence after performing the edge smoothing in the edge direction with respect to true edge position point sequence. When a short period edge position fluctuation of four or less scanning lines (the high spatial frequency component of the LER) does not become a problem, the LER can be correctly estimated by the embodiment. Further, since the threshold value method is used in the embodiment, the LER with respect to the dimensional fluctuation of a pattern bottom part and a pattern upper part can be estimated by changing a threshold value used for the edge detection.

Sixth Embodiment

FIG. 8 illustrates the GUI screen for setting the device conditions of the scanning electron microscope and the measuring method using the SEM image obtained in advance. However, the GUI screen of FIG. 8 is only one example thereof, and it may be possible to set other various image acquisition conditions, an imaging recipe, a measurement recipe, and the like in CD-SEM.

Additionally, in the example of FIG. 8, the window for setting the number of the frames acquired by the SEM or for displaying the number of the frames acquired in advance, and the window for setting the combination of the integrated images used for the regression analysis are described as examples. Additionally, a setting unit for setting edge detection algorithm for operating the LER or the PSD (the threshold method or the waveform matching method, and the like), necessary parameters (the threshold value and designation of the reference waveform), PSD operation methods (the FFT or the multitaper method, and the like), and necessary parameters (a window function and a multitaper order, and the like) may be provided.

Further, after performing the above-mentioned processing on a plurality of images captured at a plurality of different places on the wafer, and the LER and PSD obtained from a plurality of edges included in the plurality of respective images, conditions for averaging the results may be set.

The above-mentioned designation can be set from a GUI of a control console attached to a main body of a device. Further, it may be performed in such a manner that the designation is performed on an external computer while generating a measurement recipe and is read in a CD-SEM device. Alternatively, it is also possible to measure the image acquired in advance by setting the above-mentioned conditions on off-line measurement software.

REFERENCE SIGNS LIST

501: SEM (Scanning Electron Microscope)
502: pattern measuring apparatus
503: design data storage medium
504: input device
505: computation processing device
506: memory
601: electron source
602: extraction electrode
603: electron beam
604: condenser lens
605: scanning deflector
606: objective lens
607: vacuum sample chamber
608: sample stand
609: sample (wafer)
610: electron
611: secondary electron
612: conversion electrode
613: detector
614: controller
617: A/D converter
618: image processing unit
619: CPU
620: image memory
621: storage medium
622: workstation

The invention claimed is:

1. A pattern measuring method for measuring a pattern based upon detection signals obtained by scanning a beam a plurality of times on the pattern formed on a sample, the method comprising:
   acquiring signals of a plurality of frames obtained by scanning the beam a plurality of times on the pattern formed on the sample;
   generating a plurality of integration signals having the different number of integration from the signals of the plurality of frames;
   acquiring edge position information of the pattern along an edge from the plurality of respective integration signals having the different number of integration;
   obtaining a difference between the edge position information and reference position information;
   obtaining a spectral component of a specific spatial frequency of the edge or a standard deviation based upon the difference;
   performing regression analysis in which a value relating to the number of integration is set as an explanatory variable, and a value relating to the spectral component or the standard deviation is set as a target variable; and
   outputting a value obtained by the regression analysis as a roughness index value of the pattern or a noise index value included in the signals.

2. The pattern measuring method according to claim 1, wherein
   the regression analysis of the spectral component is performed on a plurality of specific spatial frequencies.

3. The pattern measuring method according to claim 1, wherein
   the regression analysis of the spectral component is performed on a plurality of specific spatial frequencies, and the noise index value included in the signals is obtained based upon a tilt of a model of the regression analysis.

4. The pattern measuring method according to claim 1, wherein
at least one of an evaluation value of frequency spectral density of roughness PSD_LER(f) and frequency spectral density of measurement noise PSD_noise(f)/NF is calculated by performing regression analysis using an equation below on spatial frequency spectral density PSD_obs(N, f) of the edge included in the plurality of integration signals having the different number of integration $$PSD\_obs(NF,f) = PSD\_LER(f) + PSD\_\text{noise}(f)/NF$$

NF: number of integration
f: spatial frequency.

5. The pattern measuring method according to claim 4, wherein
a roughness evaluation value LER is calculated based upon an equation below from a plurality of the spatial frequencies f $$LER = \sqrt{(\int PSD\_LER(f) df)}.$$

6. A computer program storage device comprising a storage medium readable by a processor and storing a program instruction executable by the processor, wherein the processor is configured to:
acquire detection signals of a plurality of frames obtained by scanning a beam a plurality of times on a pattern formed on a sample;
generate a plurality of integration signals having the different number of integration from the detection signals of the plurality of frames;
acquire edge position information of the pattern along an edge from the plurality of respective integration signals having the different number of integration;
obtain a difference between the edge position information and reference position information;
obtain a spectral component of a specific spatial frequency of the edge or a standard deviation based upon the difference;
perform regression analysis in which a value relating to the number of integration is set as an explanatory variable, and a value relating to the spectral component or the standard deviation is set as a target variable; and
output a value obtained by the regression analysis as a roughness index value of the pattern or a noise index value included in the signals.

7. The computer program storage device according to claim 6, wherein
the processor is configured to:
perform regression analysis of the spectral component on a plurality of specific spatial frequencies.

8. The computer program storage device according to claim 6, wherein
the processor is configured to:
perform regression analysis of the spectral component on a plurality of specific spatial frequencies; and
obtain the noise index value included in the signals based upon a tilt of a model of the regression analysis.

9. The computer program storage device according to claim 6, wherein
the processor is configured to:
calculate at least one of an evaluation value of frequency spectral density of roughness PSD_LER(f) and frequency spectral density of measurement noise PSD_noise(f)/NF by performing regression analysis using an equation below on spatial frequency spectral density PSD_obs(N, f) of the edge included in the plurality of integration signals having the different number of integration $$PSD\_obs(NF,f) = PSD\_LER(f) + PSD\_\text{noise}(f)/NF$$

NF: number of integration
f: spatial frequency.

10. The computer program storage device according to claim 9, wherein
the processor is configured to:
calculate a roughness evaluation value LER based upon an equation below from a plurality of the spatial frequencies f $$LER = \sqrt{(\int PSD\_LER(f) df)}.$$

11. A pattern measuring apparatus for measuring a pattern formed on a sample, comprising:
a processor;
a memory connected to the processor; and
a computer executable program code that is stored in the memory and instructs the processor to
acquire detection signals of a plurality of frames obtained by scanning a beam a plurality of times on the pattern formed on a sample;
generate a plurality of integration signals having the different number of integration from the detection signals of the plurality of frames;
acquire edge position information of the pattern along an edge from the plurality of respective integration signals having the different number of integration;
obtain a difference between the edge position information and reference position information;
obtain a spectral component of a specific spatial frequency of the edge or a standard deviation based upon the difference;
perform regression analysis in which a value relating to the number of integration is set as an explanatory variable, and a value relating to the spectral component or the standard deviation is set as a target variable; and
output a value obtained by the regression analysis as a roughness index value of the pattern or a noise index value included in the signals.

12. The pattern measuring apparatus according to claim 11, wherein
the program code instructs the processor to
perform regression analysis of the spectral component on a plurality of specific spatial frequencies.

13. The pattern measuring apparatus according to claim 11, wherein
the program code instructs the processor to
perform regression analysis of the spectral component on a plurality of specific spatial frequencies; and
obtain the noise index value included in the signals based upon a tilt of a model of the regression analysis.

14. The pattern measuring apparatus according to claim 11, wherein
the program code instructs the processor to
calculate at least one of an evaluation value of frequency spectral density of roughness PSD_LER(f) and frequency spectral density of measurement noise PSD_noise(f)/NF by performing regression analysis using an equation below on spatial frequency spectral density PSD_obs(N, f) of the edge included in the plurality of integration signals having the different number of integration $$PSD\_obs(NF,f) = PSD\_LER(f) + PSD\_\text{noise}(f)/NF$$

NF: number of integration
f: spatial frequency.

15. The pattern measuring apparatus according to claim 14, wherein
the program code instructs the processor to
calculate a roughness evaluation value LER based upon an equation below from a plurality of spatial frequencies f $$LER = \sqrt{(\int PSD\_LER(f)df)}.$$

* * * * *